(12) United States Patent
Tsorng et al.

(10) Patent No.: US 10,959,325 B2
(45) Date of Patent: Mar. 23, 2021

(54) BENDING FIXTURE AND SUPPORT COMPONENTS FOR A SEMI-FLEXIBLE PRINTED CIRCUIT BOARD ASSEMBLY

(71) Applicant: QUANTA COMPUTER INC., Taoyuan (TW)

(72) Inventors: Yaw-Tzorng Tsorng, Taoyuan (TW); Chen-Chien Kuo, Taoyuan (TW); Wei-Hsin Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 21 days.

(21) Appl. No.: 16/444,862

(22) Filed: Jun. 18, 2019

(65) Prior Publication Data
US 2020/0404779 A1    Dec. 24, 2020

(51) Int. Cl.
*H05K 1/00* (2006.01)
*H05K 1/02* (2006.01)
*H05K 5/02* (2006.01)

(52) U.S. Cl.
CPC ......... *H05K 1/0281* (2013.01); *H05K 5/0208* (2013.01); *H05K 5/0221* (2013.01); *H05K 5/0226* (2013.01); *H05K 2201/2018* (2013.01)

(58) Field of Classification Search
CPC .. H05K 1/0281; H05K 5/0208; H05K 5/0221; H05K 5/0226; H05K 2201/2018
See application file for complete search history.

(56) References Cited

U.S. PATENT DOCUMENTS

| 5,220,488 | A | 6/1993 | Denes | |
|---|---|---|---|---|
| 5,224,023 | A * | 6/1993 | Smith | G06F 1/184 174/254 |
| 5,397,239 | A | 3/1995 | Zaderej et al. | |
| 7,468,893 | B2 * | 12/2008 | Goodwin | H05K 1/189 361/760 |
| 9,733,679 | B1 * | 8/2017 | Chen | G06F 1/187 |
| 10,296,482 | B2 * | 5/2019 | Deng | G06F 13/4221 |
| 2016/0100494 | A1 * | 4/2016 | Novysedlak | H05K 5/0239 361/748 |
| 2019/0059167 | A1 * | 2/2019 | Chen | H05K 5/0069 |

(Continued)

FOREIGN PATENT DOCUMENTS

EP    2219425 A2    8/2010
TW    I439189 B    5/2014

OTHER PUBLICATIONS

Extended European Search Report for EP Application No. 19207467.2, dated May 29, 2020.

(Continued)

*Primary Examiner* — Yuriy Semenenko
(74) *Attorney, Agent, or Firm* — Nixon Peabody LLP

(57) ABSTRACT

A computing system is provided. The computing system includes a semi-flexible printed circuit board assembly (PCBA) with a first element and a second element. The first element is configured to move in a non-planar direction with respect to the second element. The computing system also includes an internal trace connecting the first element and the second element of the semi-flexible PCBA. The computing system also includes a support mechanism, which is configured to constrain relative movements between the first element with respect to the second element of the semi-flexible PCBA.

20 Claims, 11 Drawing Sheets

(56) References Cited

U.S. PATENT DOCUMENTS

2019/0230985 A1* 8/2019 Chan .................... A24F 47/008
2019/0250679 A1* 8/2019 Nguyen ............... G11B 33/126

OTHER PUBLICATIONS

TW Office Action for Application No. 108137586, dated Oct. 29, 2020, w/ Second Office Action Summary.
TW Search Report for Application No. 108137586, dated Oct. 29, 2020, w/ Second Office Action.

* cited by examiner

BENDING FIXTURE AND SUPPORT COMPONENTS FOR A SEMI-FLEXIBLE PRINTED CIRCUIT BOARD ASSEMBLY

FIELD OF THE INVENTION

The present disclosure relates to securing apparatuses that improves the life cycle of a semi-flexible printed circuit board assembly.

BACKGROUND

Servers and other computing devices generally include a variety of electronic components within a housing. For example, a server can include processing devices such as a central processing unit (CPU) or a graphics processing unit (GPU), hard drives, networking or communication components, memory devices, etc. These devices can be mounted in their own individual housings, or can be part of a semi-flexible printed circuit board assembly (PCBA). Mounting the devices on the semi-flexible PCBA can reduce the number of connectors, thereby improving signal performance.

However, the semi-flexible PCBA is susceptible to various mechanical failures. For example, a semi-flexible PCBA has a minimum bending radius that preserves the integrity of an internal trace, which connects all of the mounted devices. The internal trace can break when the semi-flexible PCBA is beyond the minimum bending radius, thereby causing a failure of the semi-flexible PCBA. Furthermore, the semi-flexible PCBA has a minimum bending life cycle; that is, the amount of times the semi-flexible PCBA can be bent in either direction before failure. For example, a semi-flexible PCBA can also fail from an internal trace break when the semi-flexible PCBA is bent beyond 10 cycles. The present disclosure is directed to solving these and other problems.

SUMMARY

A computing system is provided. The computing system includes a flexible printed circuit board assembly (PCBA) with a first element and a second element. The first element is configured to move in a non-planar direction with respect to the second element. The computing system also includes an internal trace connecting the first element and the second element of the semi-flexible PCBA. The computing system also includes a support mechanism configured to constrain relative movements between the first element with respect to the second element of the flexible PCBA.

In some embodiments, the computing system can also include a removable mounting system configured to prevent the internal trace breaching a minimum bending radius. The removable mounting system can include a bracket assembly and a support device. The support device can include an elongated body that is positioned between the first element and the second element of the semi-flexible PCBA. The support device can also include a tab element and a rounded element. The rounded element can extend from the tab element in an opposite direction of the elongated body. The rounded element can be configured to abut the internal trace to constrain the semi-flexible PCBA from breaching a minimum bending radius.

The support device can also include an interlocking element configured to be received by the bracket assembly. The interlocking element can enable the support device to rotate with respect to the bracket assembly. The bracket assembly can include a rear tab with an aperture. The rear tab can be coplanar with the first element of the semi-flexible PCBA. The bracket assembly can also include a base tab with an aperture. The base tab can be coplanar with the second element of the semi-flexible PCBA. The bracket assembly can include a side tab with an aperture configured to receive the interlocking element of the support device.

In some embodiments, the computing system can include electrical components mounted on at least the second element of the semi-flexible PCBA.

In some embodiments, the support mechanism can include a support latch configured to fix the first element with respect to the second element of the semi-flexible PCBA. The support latch can include a base element. The base element can include a securing element configured to interlock with an aperture of the second element of the semi-flexible PCBA. The base element can include a front facing tab opposite the first element of the semi-flexible PCBA. The support latch can also include a rear element. The rear element can include a securing element configured to interlock with an aperture of the first element of the semi-flexible PCBA. The support latch can also include an elongated portion connecting the rear element to the base element. The support latch can also include a rounded portion connecting the rear element to the base element.

In some embodiments, the support mechanism can include a support cable and stopper assembly configured to fix the first element with respect to the second element of the semi-flexible PCBA. The support cable and stopper assembly can include a support cable with a first end. The first end can be configured to interlock with the first element of the semi-flexible PCBA. The support cable can include a second end configured to interlock with the second element of the semi-flexible PCBA. The support cable and stopper assembly can include a stopper device with a rear surface that is coplanar with the first element of the semi-flexible PCBA. The stopper device can include a base surface that is coplanar with the second element of the semi-flexible PCBA. The stopper device can also include a curved surface adjacent to both the rear surface and the base surface.

The support mechanism can include a support attachment assembly configured to fix the first element with respect to the second element of the semi-flexible PCBA. The support attachment assembly can include a first attachment element with a slot element configured to receive a portion of the first element. The support attachment assembly can include a second attachment element with a slot element configured to receive a portion of the second element.

Additional features and advantages of the disclosure will be set forth in the description that follows, and in part, will be obvious from the description, or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited disclosure and its advantages and features can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

DETAILED DESCRIPTION

Figure 1A:
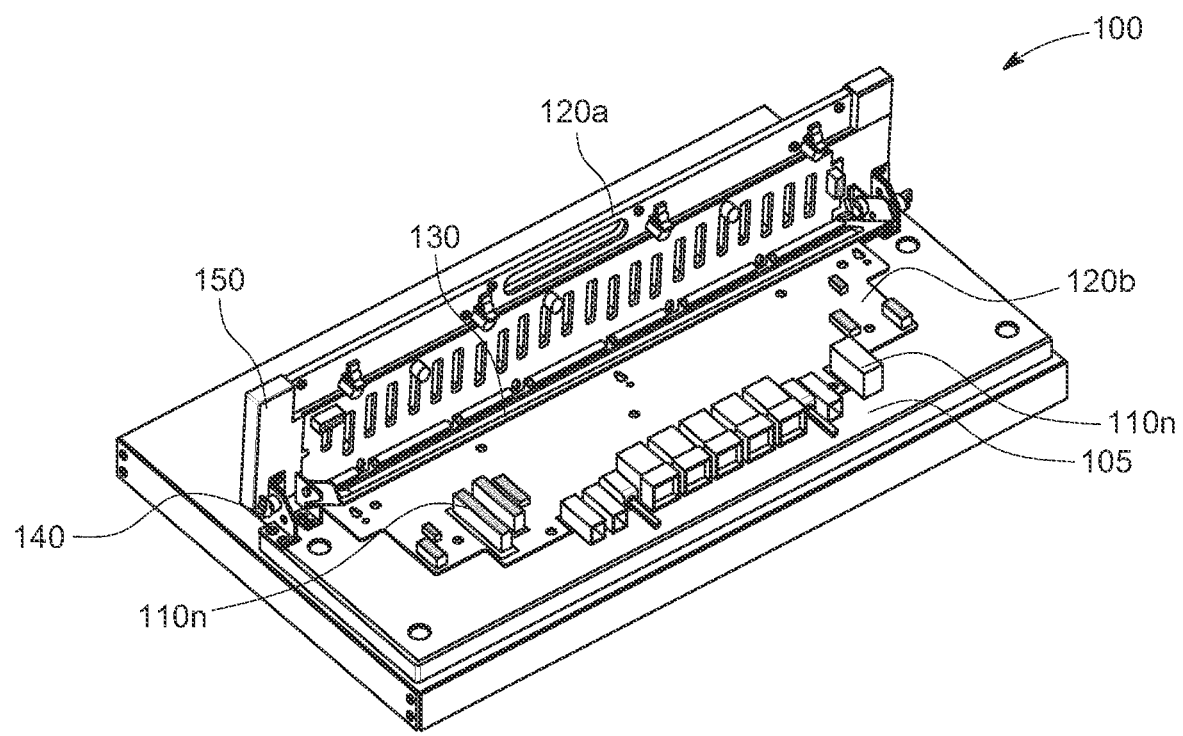
FIG. 1A illustrates a printed circuit board assembly with a support device and bracket, in accordance with an implementation of the disclosure.

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A illustrates a computing system 100 that includes a semi-flexible printed circuit board assembly (PCBA) with a removable mounting system, in accordance with an implementation of the disclosure. The semi-flexible PCBA can include a first element 120(*a*) and a second element 120(*b*). In some embodiments, the first element 120(*a*) is configured to move in a non-planar direction with respect to the second element 120(*b*). The first element 120(*a*) can be perpendicular or substantially perpendicular with the second element 120(*b*). The removable mounting system can include a support device 130 and a bracket 140. It should be understood that some embodiments of the computing system 100 can omit the support device 130.

Figure 2:
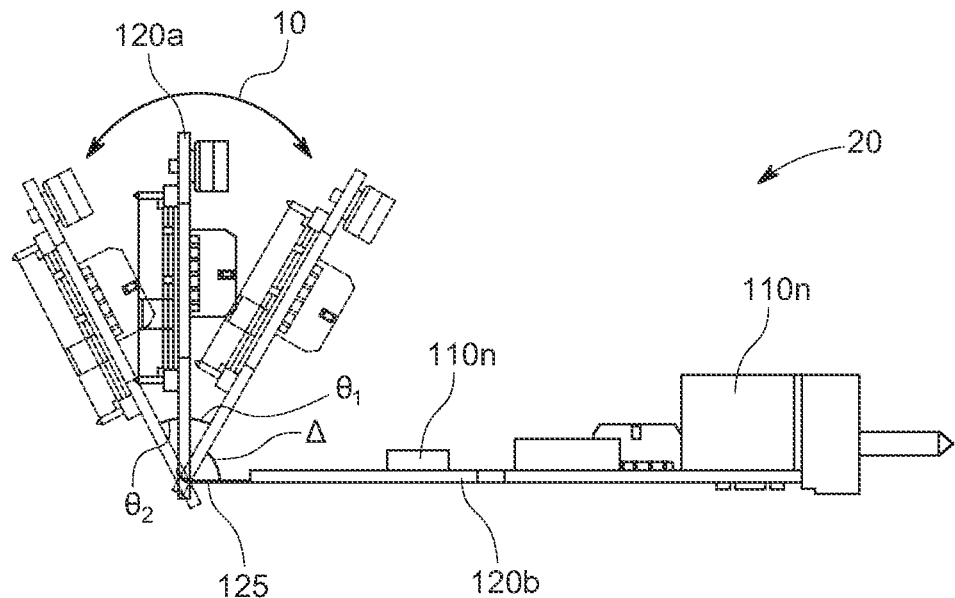
FIG. 2 illustrates an exemplary printed circuit board assembly, in accordance with an implementation of the disclosure.

Referring momentarily to FIG. 2, the first element 120(*a*) of the semi-flexible PCBA is configured to move in a direction 10 with respect to the second element 120(*b*). The first element 120(*a*) and the second element 120(*b*) can be separated by an angle Δ. The first element 120(*a*) of the PCBA can oscillate between angles $\theta_1$ and $\theta_2$. The oscillation of the first element 120(*a*) increases or decreases the angle Δ. The semi-flexible PCBA can have a minimum bending radius of 3.5 mm, that once breached, will cause a failure of the semi-flexible PCBA.

Referring back to FIG. 1A, the second element 120(*b*) of the semi-flexible PCBA can be fixed to a base 105 of the computing system 100. The first element 120(*a*) of the semi-flexible PCBA can be fixed to a wall structure 150 of the computing system 100. It should be understood that the present disclosure illustrates the semi-flexible PCBA in free-standing form and fixed to the aforementioned structures. The first element 120(*a*) is able to move with respect to the second element 120(*b*) in either configuration. The computing system 100 can also include electrical components 110(*n*) mounted on the first element 120(*a*) and/or the second element 120(*b*) of the semi-flexible PCBA. Each of the electrical components 110(*n*) can be connected to one another by an internal trace (shown in FIG. 1B). The support device 130 can include an elongated body, positioned between the first element 120(*a*) and the second element 120(*b*) of the semi-flexible PCBA.

Figure 1B:
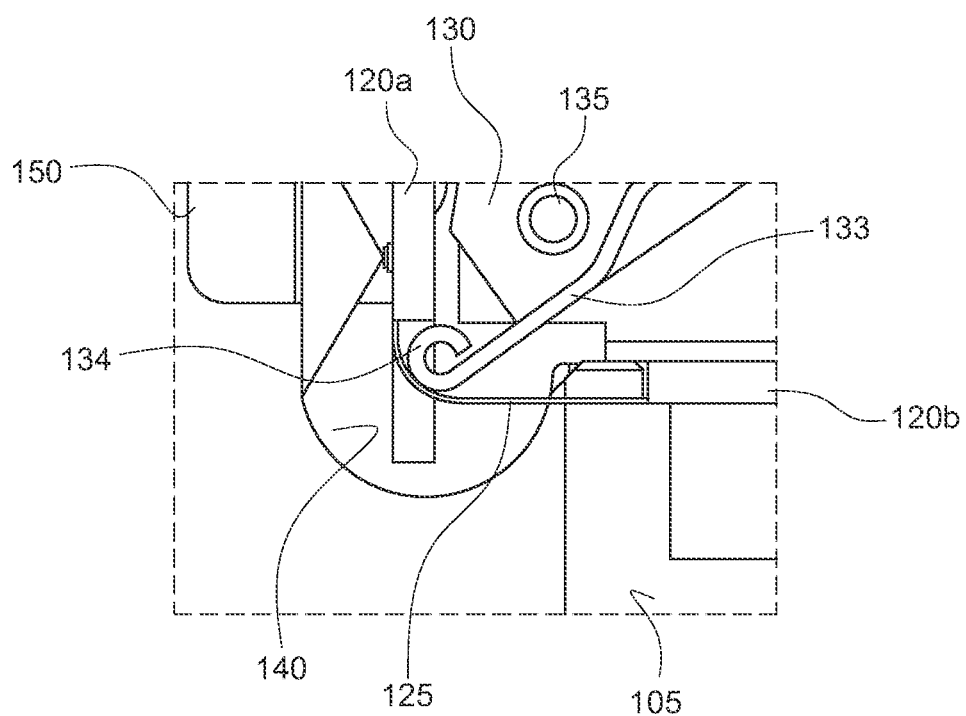
FIG. 1B illustrates the support device supporting a curvature of the printed circuit board assembly of FIG. 1A, in accordance with an implementation of the disclosure.

FIG. 1B illustrates the support device 130 supporting a curvature of the internal trace 125 of FIG. 1A, in accordance with an implementation of the disclosure. The internal trace 125 can be configured to interconnect the first element 120(*a*) and the second element 120(*b*) of the semi-flexible PCBA. The support device 130 and the bracket 140 can be configured to constrain any movement of the first element 120(*a*) and the second element 120(*b*) of the semi-flexible PCBA. In some embodiments, the support device 130 can include a tab element 133 and a rounded element 134. The rounded element 134 can extend from the tab element 133 in an opposite direction of the elongated body. The rounded element 134 can be configured to abut the internal trace 125 and constrain the semi-flexible PCBA from breaching a minimum bending radius. In some embodiments, the minimum bending radius is 3.5 mm. In some embodiments, the rounded element 134 can be configured as a metal plate. The rounded element 134 can include a metal surface covered with a Mylar coating to prevent the metal surface contact with the internal trace 125.

The support device 130 can also include an interlocking element 135. The interlocking element 135 can be configured to be received by the bracket assembly 140. The interlocking element 135 can also enable the support device 130 to rotate with respect to the bracket assembly 140.

Figure 1C:
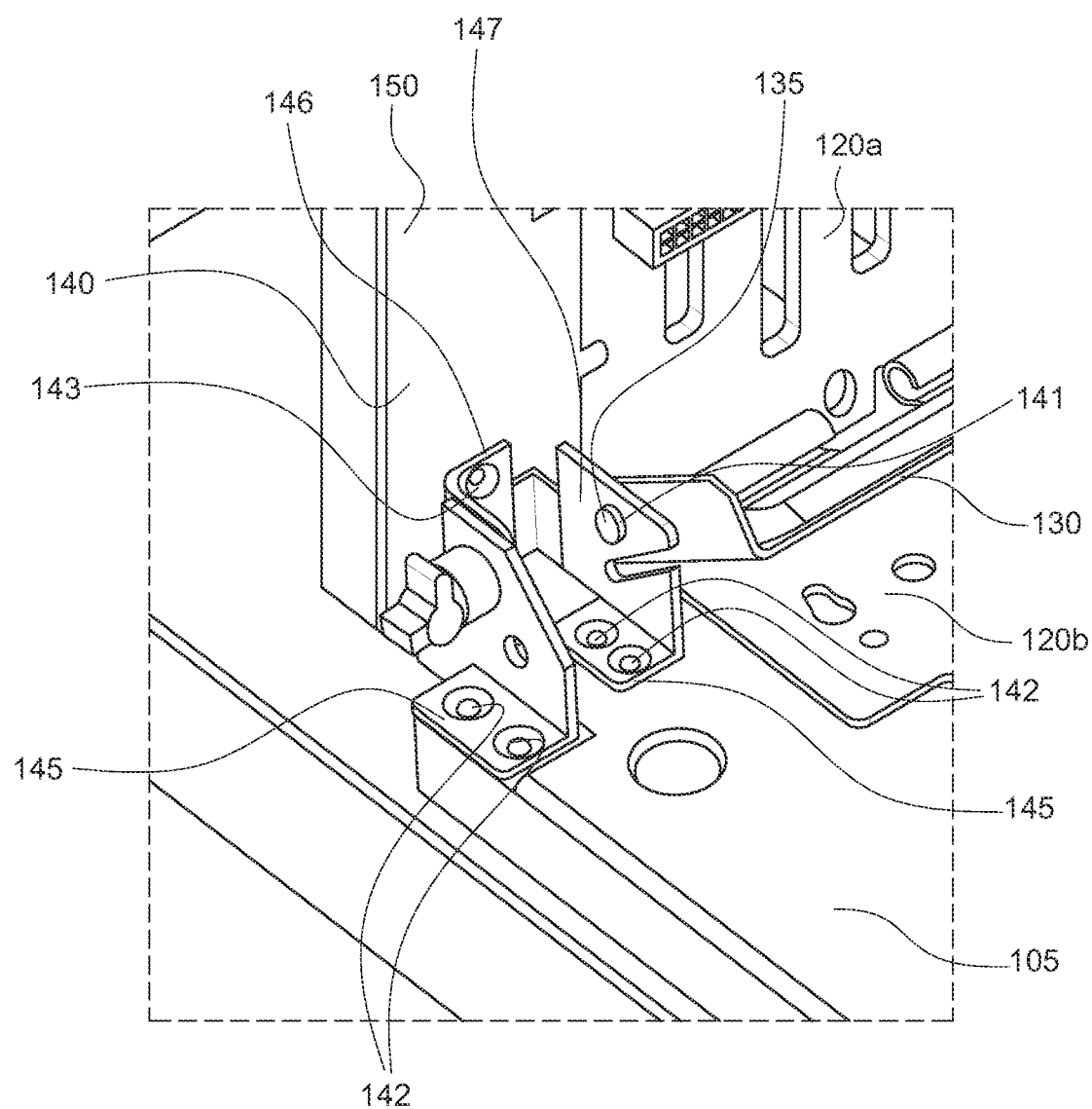
FIG. 1C illustrates the bracket supporting the printed circuit board assembly of FIG. 1A, in accordance with an implementation of the disclosure.

FIG. 1C illustrates the bracket assembly 140 supporting the semi-flexible PCBA of FIG. 1A, in accordance with an implementation of the disclosure. In some embodiments, the bracket assembly 140 includes a rear tab 146 with at least one aperture 143. The rear tab 146 can be coplanar with the first element 120(*a*) of the semi-flexible PCBA. The at least one aperture 143 is configured to receive a fastening element (not shown) to secure the rear tab 146 to the wall structure 150. In an alternative embodiment, the fastening element can be implemented to secure the rear tab 146 to the first element 120(*a*) of the semi-flexible PCBA.

The bracket assembly 140 also includes at least one base tab 145, each with at least one aperture 142. The base tab 145 can be coplanar with the second element 120(*b*) of the semi-flexible PCBA. The aperture 142 can be configured to receive a fastening element (not shown) to secure the base tab 145 to the base 105. In an alternative embodiment, the fastening element can be implemented to secure the base tab 145 to the second element 120(*b*) of the semi-flexible PCBA. The bracket assembly 140 can also include a side tab 147 with at least one aperture 141. The aperture 141 can be configured to receive the interlocking element 135 of the support device 130. The combination of the bracket assembly 140 and the support device 130 fully supports the first element 120(*a*) and the second element 120(*b*) of the semi-flexible PCBA without exceeding a tolerance, which would cause the semi-flexible PCBA to fail. Both the bracket assembly 140 and the support device 130 allow for movement of the first element 120(*a*) about the second element 120(*b*). There is a clearance between the aperture 141 and the interlocking element 135. This clearance enables the support device 130 to be flexible.

In some embodiments, the rounded element 134 can be made up of sheet metal with two press fit pin on both ends of the rounded element 134. The press fit pin can be arranged to slide into slit on the side tab 147. The mating of the press fit pin of the rounded element and the slit of the side tab 147 can constrain rotation of the rounded element 134.

The support device 130 helps to form the radius of the printed circuit board assembly during a folding process. In the folding process, the bending angle is changed from zero-degrees to ninety-degrees. In the embodiments discussed below, the support device 130 can be implemented then subsequently removed once the printed circuit board assembly is bent to the projected ninety-degrees. The embodiments discussed below in greater detail is then used to maintain the bending angle and withstand the force that could potentially damage the printed circuit board assembly. Furthermore, certain embodiments also provide an ability to conduct electric power between the perpendicular sections of the printed circuit board assembly.

Figure 3A:
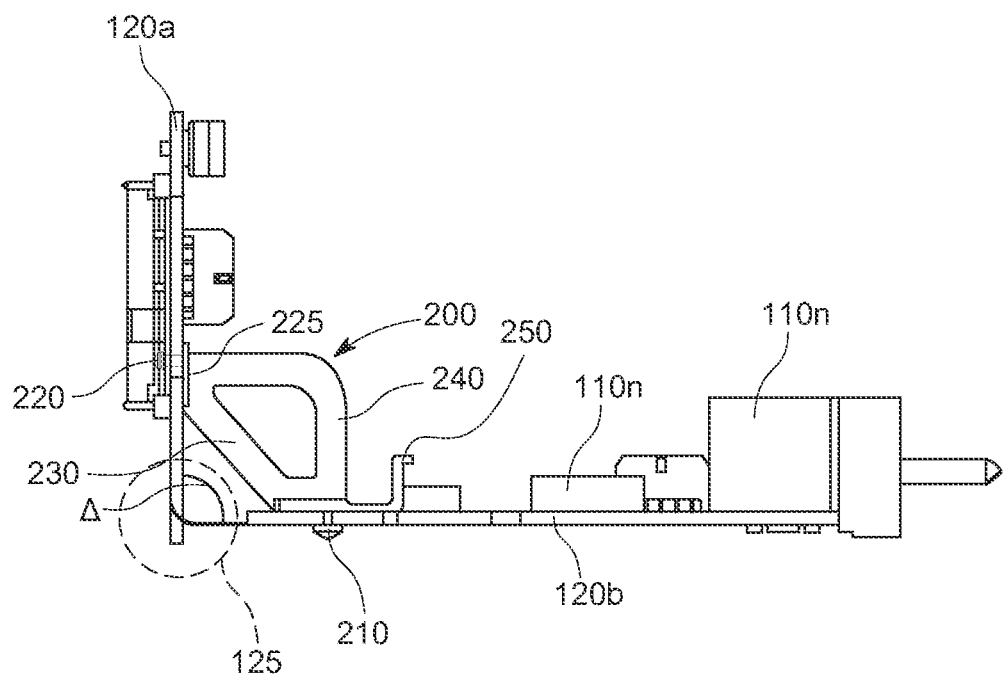
FIG. 3A illustrates a side view of a printed circuit board assembly (PCBA) with a support latch, in accordance with an implementation of the disclosure.

FIG. 3A illustrates a side view of the semi-flexible PCBA with a support latch 200, in accordance with an implementation of the disclosure. The support latch 200 can be configured to fix the first element 120(*a*) with respect to the second element 120(*b*) of the semi-flexible PCBA. The support latch 200 can include a base element 250. The base element can include securing elements 210, each configured to interlock with an aperture of the second element 120(*b*) of the semi-flexible PCBA. The interlocking of the securing elements 210 and the aperture of the second element 120(*b*) secures the base element 250 (and the support latch 200) to the second element 120(*b*).

The support latch 200 can also include a rear element 225 that is non-planar with the base element 250. The rear element 225 can include a securing element 220, which is configured to interlock with an aperture (not shown) of the first element 120(*a*) of the semi-flexible PCBA. The interlocking of the securing element 220 and the aperture of the first element 120(*a*) secures the rear element 225 (and the support latch 200) to the first element 120(*a*).

Figure 3B:
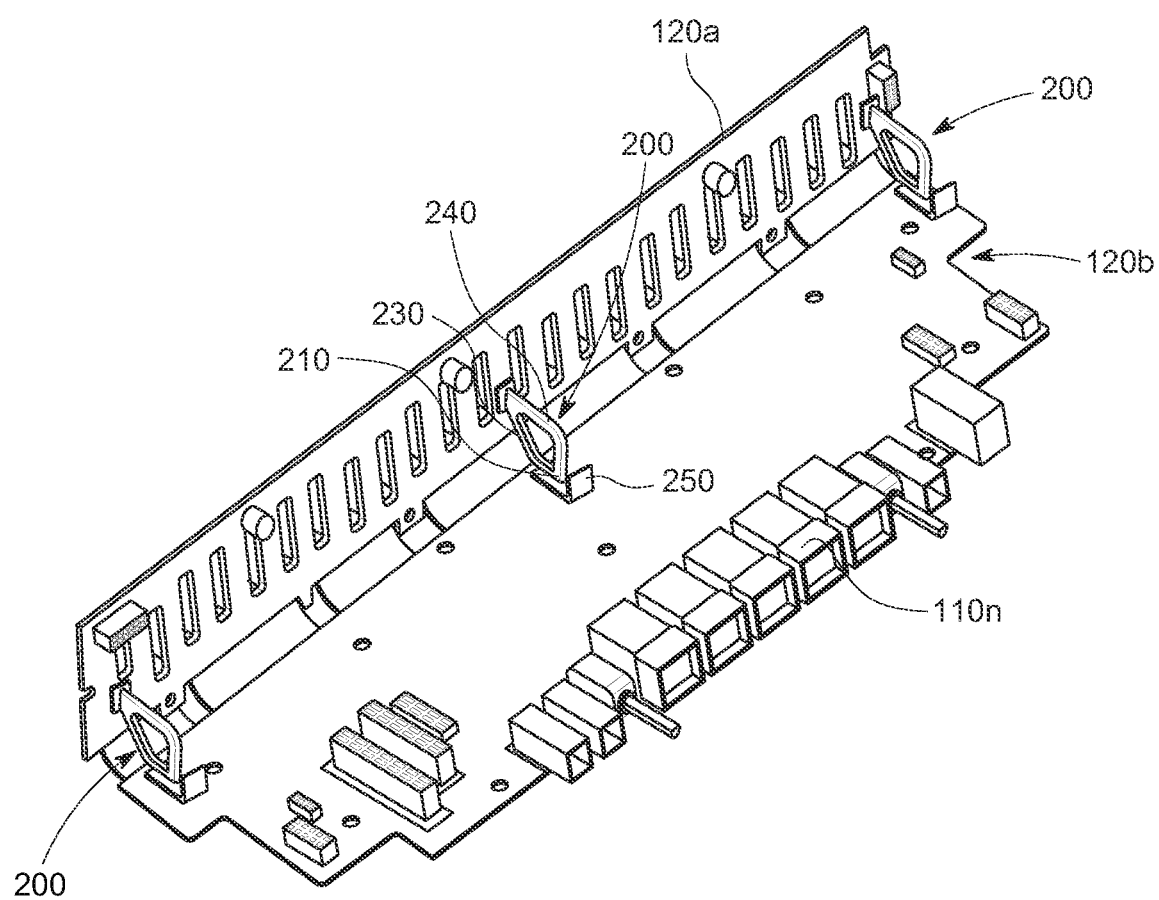
FIG. 3B illustrates a top perspective view of the PCBA incorporating multiple support latches, in accordance with an implementation of the disclosure.

FIG. 3B illustrates a top perspective view of the semi-flexible PCBA, incorporating multiple support latches 200, in accordance with an implementation of the disclosure. It should be understood that the support latch 200 is configured to provide stability to the semi-flexible PCBA. The support latch 200 provides stability by constraining movement of the first element 120(*a*) with respect to the second element 120(*b*). In some embodiments, one support latch 200 is implemented to provide this stability. In alternative embodiments, multiple support latches 200 can be implemented, where each support latch 200 is equally spaced apart from one another.

Figure 3C:
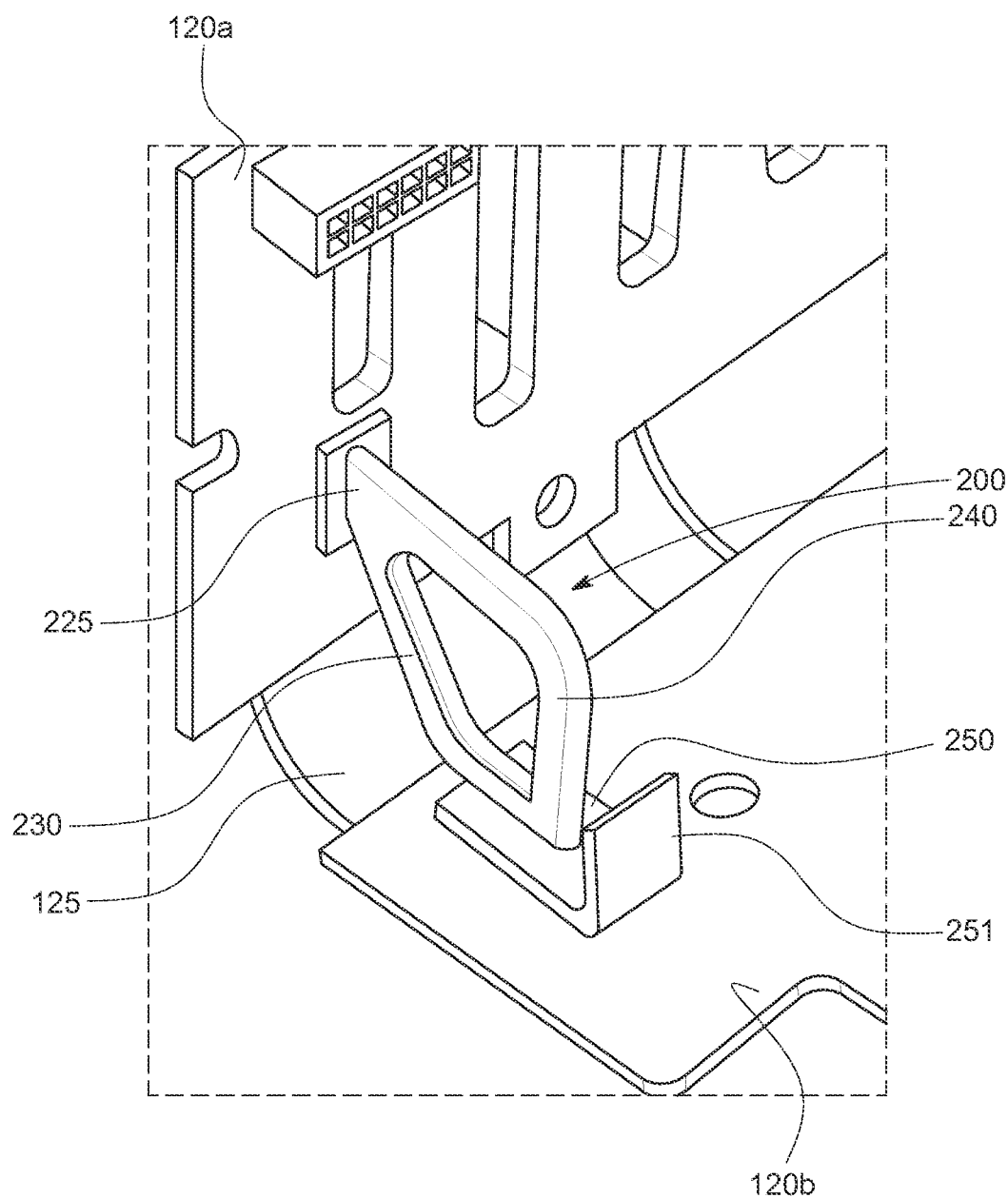
FIG. 3C illustrates the support latch mounted to the PCBA of FIG. 3A, in accordance with an implementation of the disclosure.

FIG. 3C illustrates the support latch 200 mounted to the PCBA of FIG. 3A, in accordance with an implementation of the disclosure. The support latch 200 can include an elongated portion 230, which connects the rear element 225 to the base element 250. The support latch 200 can also include a rounded portion 240, opposite the elongated portion 230. The rounded portion 250 can connect the rear element 225 to the base element 250. The base element 250 can also include a front facing tab 251 opposite the first element 120(*a*) of the semi-flexible PCBA.

Figure 3D:
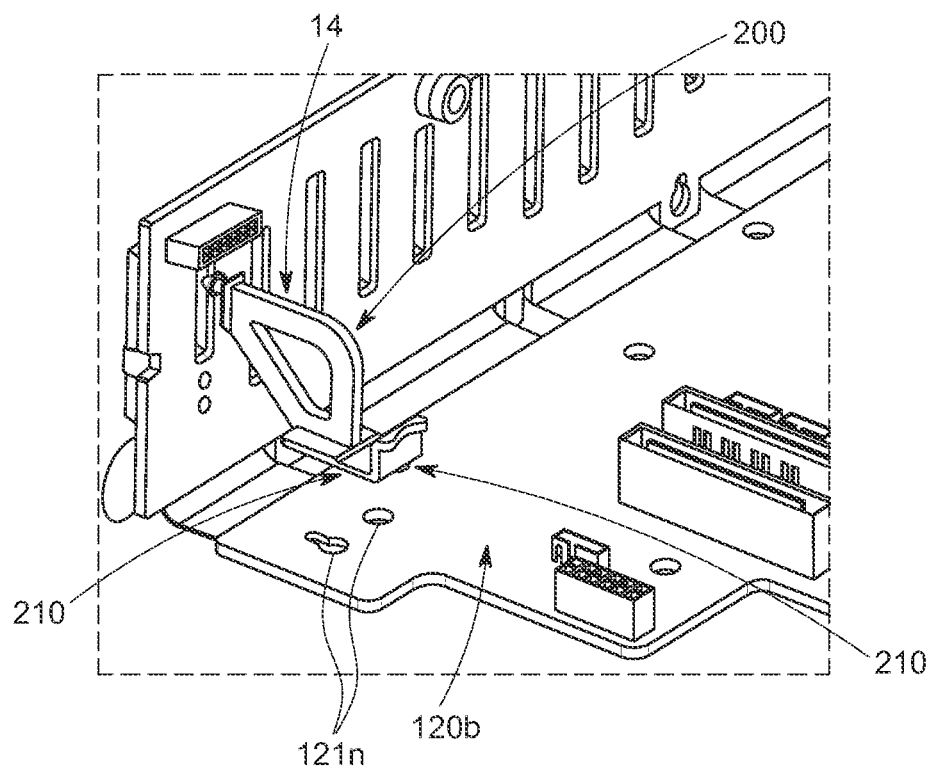
FIG. 3D illustrates the initial phase of mounting the support latch to the PCBA of FIG. 3A, in accordance with an implementation of the disclosure.

FIG. 3D illustrates the initial phase of mounting the support latch 200 to the PCBA of FIG. 3A, in accordance with an implementation of the disclosure. The second element 120(*b*) can include apertures 121(*n*). During the initial phase of mounting the support latch 200, the securing elements 210 can be aligned with the apertures 121(*n*). Once aligned, the support latch 200 can be advanced towards the second element 120(*b*) in direction 14. At least one of the apertures 121(*n*) has a smaller aperture notched to a primary aperture. This configuration allows the securing element 210 to be secured in the smaller aperture with less tolerance than the primary aperture 121(*n*).

Figure 3E:
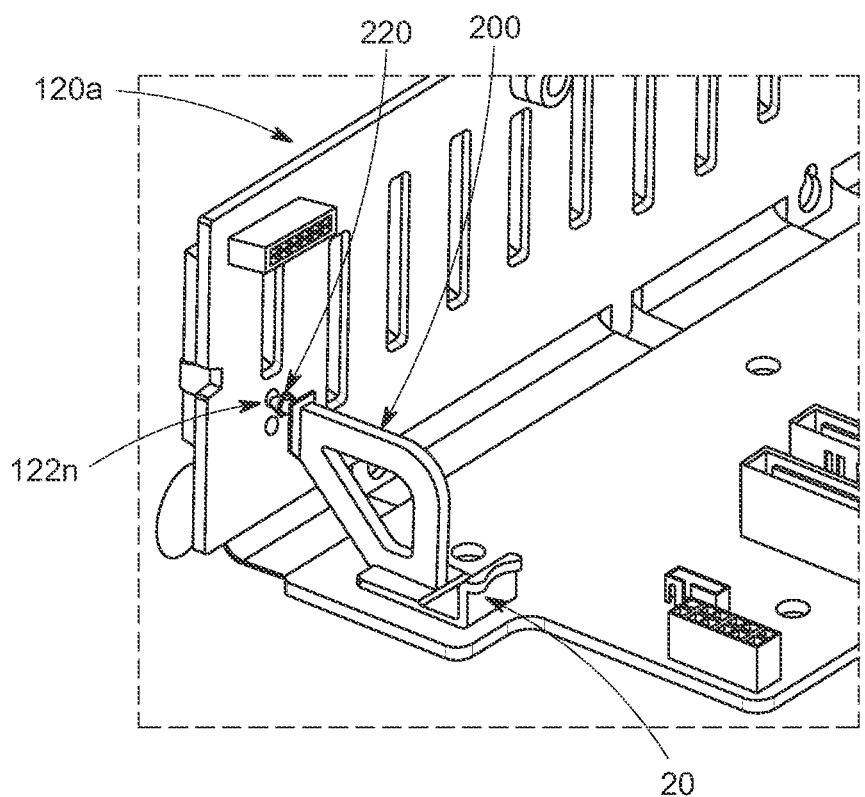
FIG. 3E illustrates the secondary phase of mounting the support latch to the PCBA of FIG. 3A, in accordance with an implementation of the disclosure.
Figure 3F:
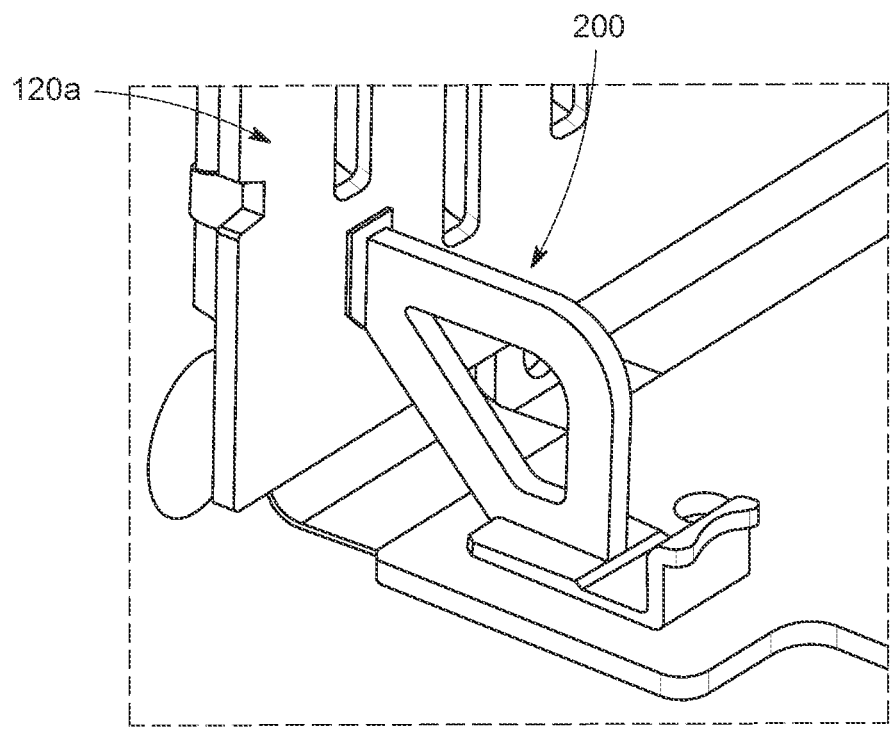
FIG. 3F illustrates the latching of securing element and the aperture of the first element of the PCBA, in accordance with an implementation of the disclosure.
Figure 3G:
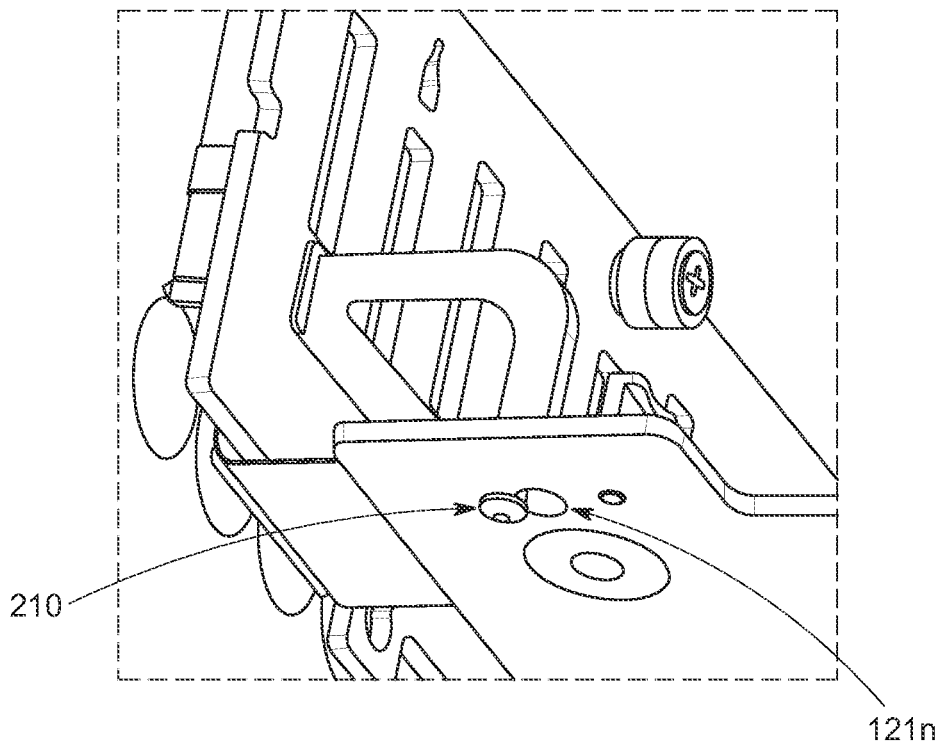
FIG. 3G illustrates the latching of the securing element and the aperture of the second element of the PCBA, in accordance with an implementation of the disclosure.

FIG. 3E illustrates the secondary phase of mounting the support latch 200 to the semi-flexible PCBA of FIG. 3A, in accordance with an implementation of the disclosure. Once the securing elements (not shown) are inserted within the apertures (not shown), securing element 220 are aligned with apertures 122(*n*) of the first element 120(*a*). A force 20 is applied to the front facing tab 251. Accordingly, the securing element 220 is advanced towards the aperture 122(*n*) and subsequently engaged with the aperture 122(*n*). FIG. 3F illustrates the support latch 200 secured to the first element 120(*a*) upon the latching of the securing element (not shown) and the aperture (not shown). FIG. 3G illustrates the latching of the securing element 210 and the aperture 121(*n*) of the second element 120(*b*).

Figure 4A:
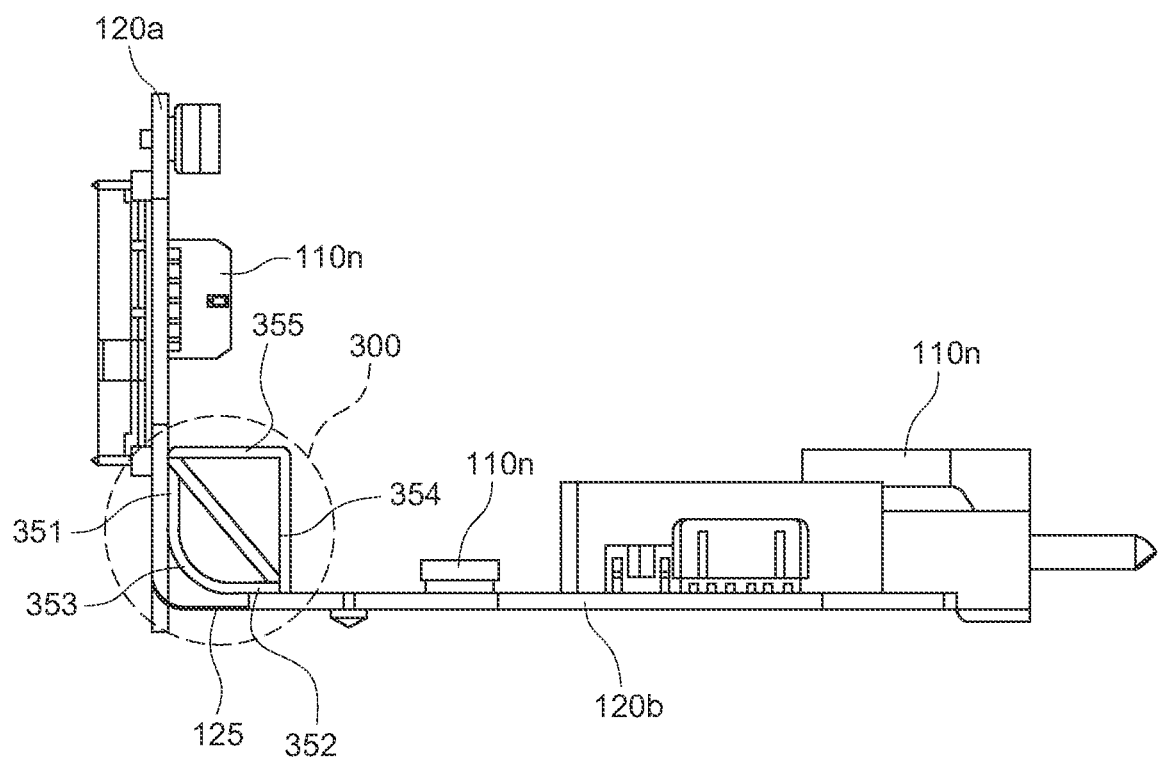
FIG. 4A illustrates a side view of a printed circuit board assembly with a support cable and stopper assembly, in accordance with an implementation of the disclosure.

FIG. 4A illustrates a side view of a semi-flexible PCBA with a support cable and stopper assembly 300, in accordance with an implementation of the disclosure. Similar to the support latch 200, the support cable and stopper assembly 300 can be configured to fix the first element 120(*a*) with respect to the second element 120(*b*).

Figure 4B:
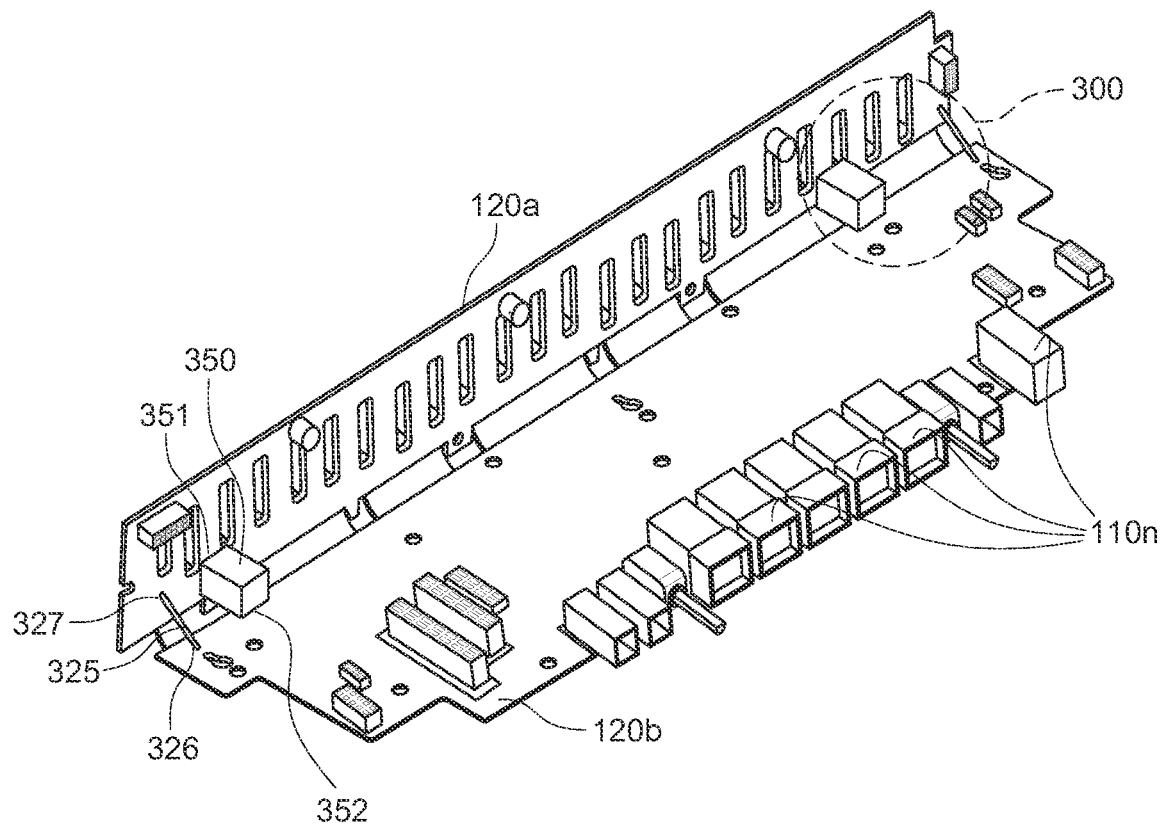
FIG. 4B illustrates a top perspective view of the printed circuit board assembly incorporating multiple support cable and stopper assemblies, in accordance with an implementation of the disclosure.

FIG. 4B illustrates a top perspective view of the semi-flexible PCBA incorporating multiple support cable and stopper assemblies, in accordance with an implementation of the disclosure. The support cable and stopper assembly 300 can include a support cable 325 and a stopper device 350 (in FIG. 4C). The support cable 325 can include a first end 327 and a second end 326. The first end 327 can be configured to interlock with connectors within the first element 120(a). The second end 326 can be configured to interlock with connectors within the second element 120(b). The support cable 325 is configured to transfer electric power between the first element 120(a) and the second element 120(b).

Figure 4C:
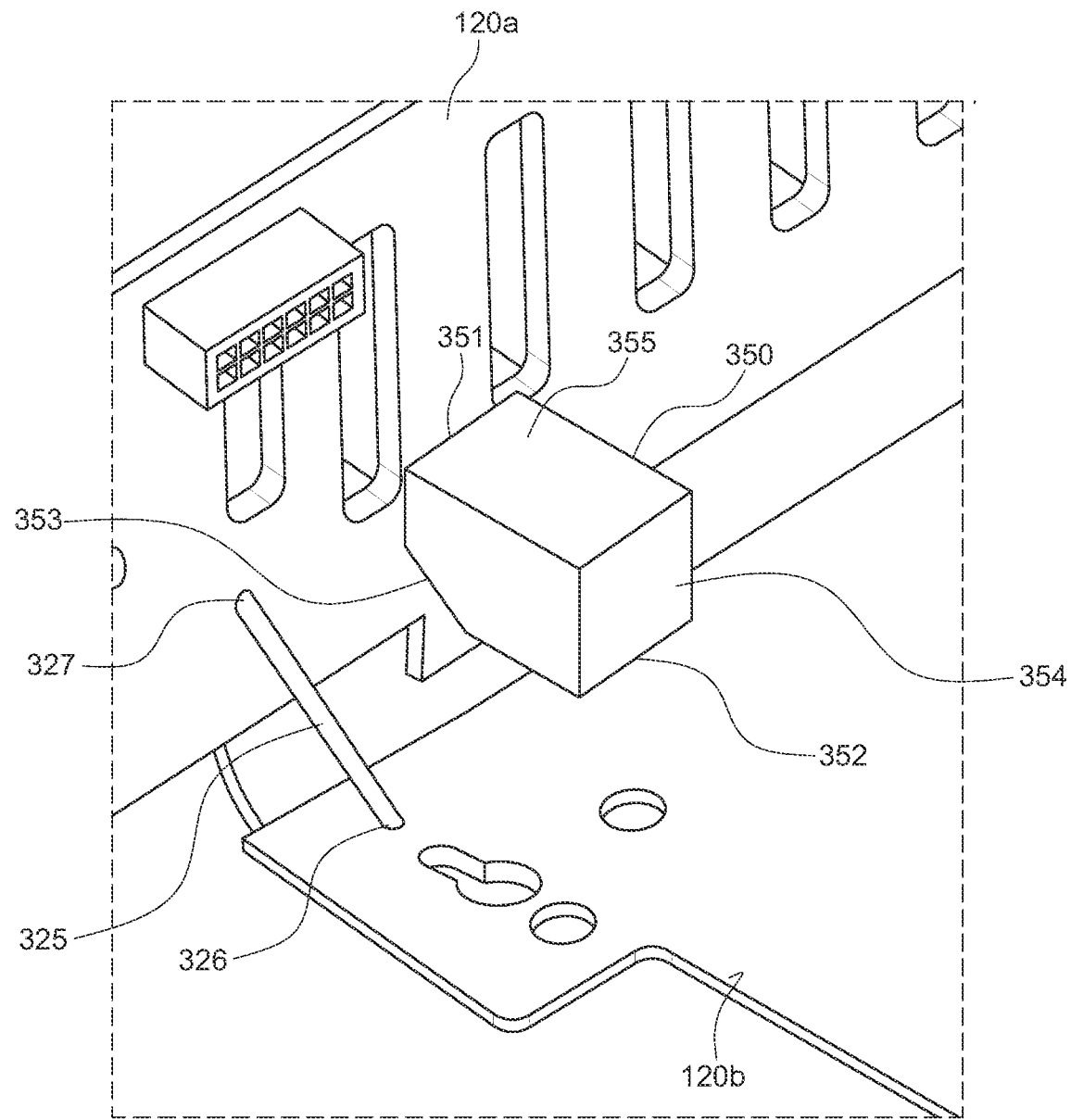
FIG. 4C illustrates the support cable and stopper assembly supporting the printed circuit board assembly of FIG. 4A, in accordance with an implementation of the disclosure.

FIG. 4C illustrates the support cable and stopper assembly supporting the semi-flexible PCBA of FIG. 4A, in accordance with an implementation of the disclosure. The stopper device 350 can include a rear surface 351 that is coplanar with the first element 120(a) of the semi-flexible PCBA. The stopper device 350 can also include a base surface 352 that is coplanar with the second element 120(b) of the semi-flexible PCBA. The stopper device 350 can include a curved surface 353 that is adjacent to both the rear surface 351 and the base surface 352.

The stopper device 350 can also include a front facing surface 354 that is coplanar with the rear surface 351. The front facing surface 354 is also adjacent to the base surface 352. The stopper device 350 can also include a top surface 355 that is adjacent to the rear surface 351 and the front facing surface 354.

Figure 5A:
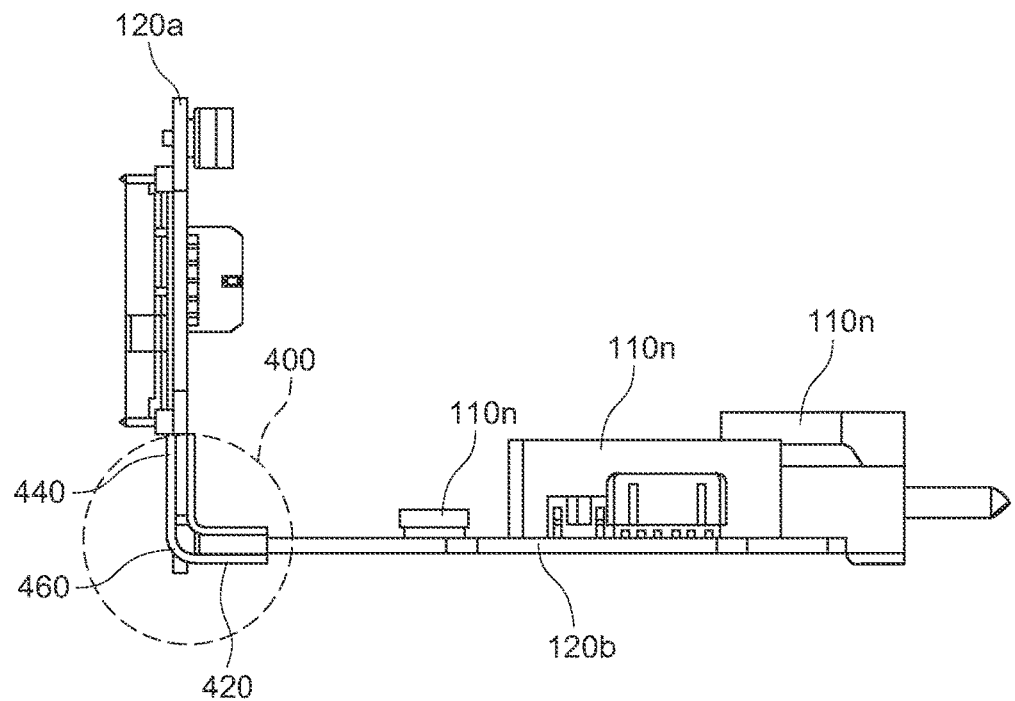
FIG. 5A illustrates a side view of a printed circuit board assembly with a support attachment assembly, in accordance with an implementation of the disclosure.

FIG. 5A illustrates a side view of the semi-flexible PCBA with a support attachment assembly 400, in accordance with an implementation of the disclosure. The support attachment assembly 400 can be configured to fix the first element 120(a) with respect to the second element 120(b) of the semi-flexible PCBA. The support attachment assembly 400 can include a first attachment element 440 and a second attachment element 420. The first attachment element 440 can be connected to the second attachment element 420 by a curved element 460.

Figure 5B:
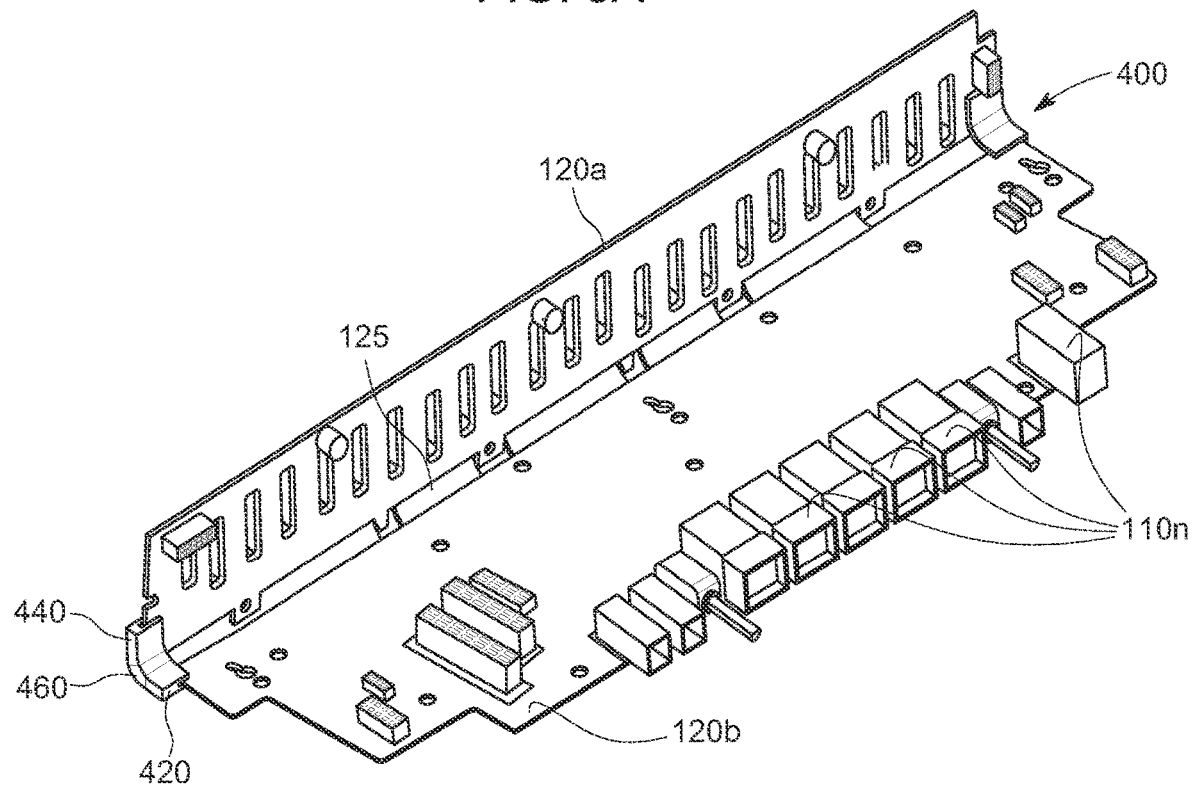
FIG. 5B illustrates a top perspective view of the printed circuit board assembly incorporating multiple support attachment assemblies, in accordance with an implementation of the disclosure.

FIG. 5B illustrates a top perspective view of the semi-flexible PCBA incorporating multiple support attachment assemblies 400, in accordance with an implementation of the disclosure. It should be understood that the support attachment assembly can be mounted to an end of the semi-flexible PCBA. The support attachment assembly 400 does not require any custom designed apertures within the semi-flexible PCBA. Rather, the support attachment assembly 400 can be attached directly to the first element 120(a) and the second element 120(b) of the semi-flexible PCBA.

Figure 5C:
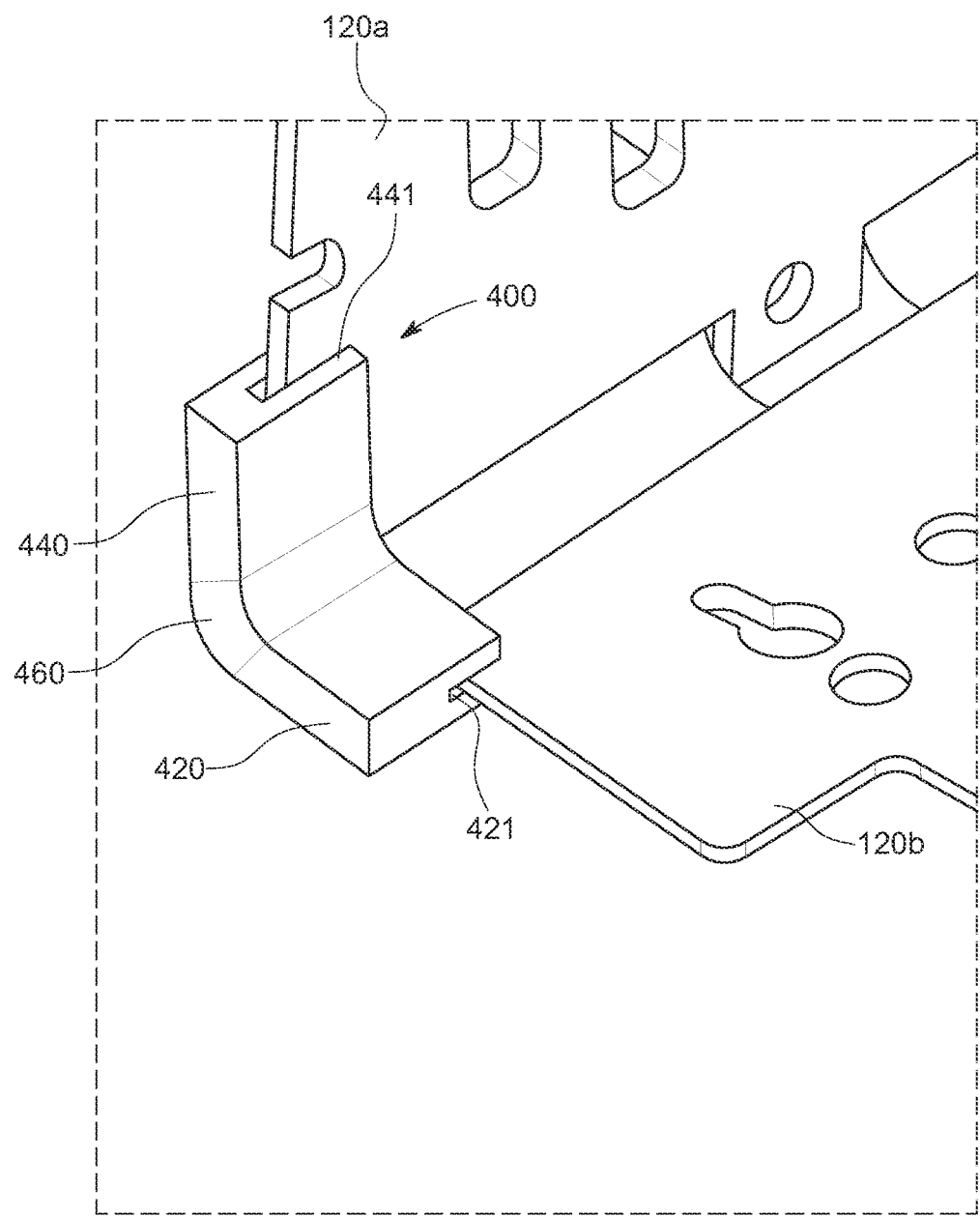
FIG. 5C illustrates the attachment assembly supporting the printed circuit board assembly of FIG. 5A, in accordance with an implementation of the disclosure.

FIG. 5C illustrates the attachment assembly 400 supporting the semi-flexible PCBA of FIG. 5A, in accordance with an implementation of the disclosure. The first attachment element 440 can include a slot element 441 configured to receive a portion of the first element 120(a). The second attachment element 420 can include a slot element 421 configured to receive a portion of the second element 120(b). In some embodiments, the curved element 460 can be flexible, allowing the first element 120(a) to move with respect to the second element 120(b). The first attachment element 440 and the second attachment element 420 can be rigid, ensuring a secure mounting of the first element 120(a) and the second element 120(b). Alternatively, the support attachment assembly 400 can be constructed as a uniform structure with a consistent amount of flexibility in all of its components.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A computing system comprising:
   a semi-flexible printed circuit board assembly (PCBA) with a first element and a second element, wherein the first element rotates in a non-planar rotation relative to the second element; and
   a support device supporting a curvature of an internal trace, the support device being configured to constrain relative movements between the first element and the second element of the semi-flexible PCBA, the internal trace connecting an electrical component between the first element and the second element of the semi-flexible PCBA.

2. The computing system of claim 1, further comprising a removable mounting system, the mounting system configured to prevent the internal trace breaching a minimum bending radius.

3. The computing system of claim 2, wherein the removable mounting system comprises a bracket assembly and a support device.

4. The computing system of claim 3, wherein the support device comprises an elongated body positioned between the first element and the second element of the semi-flexible PCBA.

5. The computing system of claim 4, wherein the support device comprises a tab element and a rounded element extending from the tab element opposite the elongated body, wherein the rounded element is configured to abut the internal trace and constrain the semi-flexible PCBA from breaching a minimum bending radius.

6. The computing system of claim 3, wherein the support device comprises an interlocking element configured to be received by the bracket assembly and enable the support device to rotate with respect to the bracket assembly.

7. The computing system of claim 6, wherein the bracket assembly comprises:

a rear tab with at least one aperture, wherein the rear tab is coplanar with the first element of the semi-flexible PCBA;

at least one base tab with at least one aperture, wherein the at least one base tab is coplanar with the second element of the semi-flexible PCBA; and a side tab with at least one aperture configured to receive the interlocking element of the support device.

8. The computing system of claim 1, further comprising a plurality of electrical components mounted on at least the second element of the semi-flexible PCBA.

9. The computing system of claim 1, wherein the support device comprises at least one support latch configured to fix the first element with respect to the second element of the semi-flexible PCBA.

10. The computing system of claim 9, wherein the at least one support latch comprises a base element, wherein the base element comprises at least one securing element configured to interlock with an aperture of the second element of the semi-flexible PCBA.

11. The computing system of claim 10, wherein the base element comprises a front facing tab opposite the first element of the semi-flexible PCBA.

12. The computing system of claim 10, wherein the at least one support latch comprises a rear element, wherein the rear element comprises a securing element configured to interlock with an aperture of the first element of the semi-flexible PCBA.

13. The computing system of claim 12, wherein the at least one support latch comprises an elongated portion connecting the rear element to the base element, and a rounded portion, opposite the elongated portion, connecting the rear element to the base element.

14. The computing system of claim 1, wherein the support device comprises at least one support cable and stopper assembly configured to fix the first element with respect to the second element of the semi-flexible PCBA.

15. The computing system of claim 14, wherein the at least one support cable and stopper assembly comprises a support cable with a first end, the first end is configured to interlock with the first element of the semi-flexible PCBA.

16. The computing system of claim 15, wherein the support cable comprises a second end configured to interlock with the second element of the semi-flexible PCBA.

17. The computing system of claim 14, wherein the at least one support cable and stopper assembly comprises a stopper device with a rear surface that is coplanar with the first element of the semi-flexible PCBA.

18. The computing system of claim 17, wherein the stopper device comprises a base surface that is coplanar with the second element of the semi-flexible PCBA, and a curved surface adjacent to both the rear surface and the base surface.

19. The computing system of claim 1, wherein the support device comprises at least one support attachment assembly configured to fix the first element with respect to the second element of the semi-flexible PCBA.

20. The computing system of claim 19, wherein the at least one support attachment assembly comprises a first attachment element with a slot element configured to receive a portion of the first element, and a second attachment element with a slot element configured to receive a portion of the second element.

* * * * *